United States Patent
Park et al.

(10) Patent No.: US 10,214,610 B2
(45) Date of Patent: Feb. 26, 2019

(54) POLYMER AND COMPOSITION CONTAINING SAME

(71) Applicants: DNF CO., LTD., Daejeon (KR); SKC CO., LTD., Suwon-si, Gyeonggi-do (KR); Joo Hyeon Park, Cheonan-si (KR)

(72) Inventors: Joo Hyeon Park, Cheonan-si (KR); Myong Woon Kim, Daejeon (KR); Sang Ick Lee, Daejeon (KR); Tae Seok Byun, Daejeon (KR); Seung Son, Daejeon (KR); Yong Hee Kwone, Cheongju-si (KR); In Kyung Jung, Daegu (KR); Joon Sung Ryou, Hwaseong-si (KR)

(73) Assignees: DNF CO., LTD., Daejeon (KR); SKC CO., LTD., Suwon-si (KR); Joo Hyeon Park, Cheonan-Si (KR)

( * ) Notice: Subject to any disclaimer, the term of this patent is extended or adjusted under 35 U.S.C. 154(b) by 286 days.

(21) Appl. No.: 14/913,194

(22) PCT Filed: Aug. 22, 2014

(86) PCT No.: PCT/KR2014/007815
§ 371 (c)(1),
(2) Date: Feb. 19, 2016

(87) PCT Pub. No.: WO2015/026194
PCT Pub. Date: Feb. 26, 2015

(65) Prior Publication Data
US 2016/0200853 A1    Jul. 14, 2016

(30) Foreign Application Priority Data

Aug. 23, 2013  (KR) .................. 10-2013-0100031
Aug. 14, 2014  (KR) .................. 10-2014-0105840

(51) Int. Cl.
| | | |
|---|---|---|
| C08G 8/04 | (2006.01) | |
| G03F 7/11 | (2006.01) | |
| H01L 51/00 | (2006.01) | |
| G03F 7/09 | (2006.01) | |
| C08G 61/12 | (2006.01) | |
| C09D 161/06 | (2006.01) | |
| H01L 21/027 | (2006.01) | |

(52) U.S. Cl.
CPC .............. *C08G 8/04* (2013.01); *C08G 61/12* (2013.01); *C09D 161/06* (2013.01); *G03F 7/094* (2013.01); *G03F 7/11* (2013.01); *H01L 21/0271* (2013.01); *H01L 51/0035* (2013.01); *H01L 51/0039* (2013.01); *C08G 2261/12* (2013.01); *C08G 2261/124* (2013.01); *C08G 2261/135* (2013.01); *C08G 2261/344* (2013.01); *C08G 2261/3424* (2013.01); *C08G 2261/76* (2013.01)

(58) Field of Classification Search
CPC ...................................... C08G 8/04
USPC ....................................... 528/153
See application file for complete search history.

(56) References Cited

U.S. PATENT DOCUMENTS

| | | |
|---|---|---|
| 6,080,522 A | 6/2000 | Ito et al. |
| 7,303,855 B2 | 12/2007 | Hatakeyama et al. |
| 7,632,622 B2 | 12/2009 | Uh et al. |
| 7,981,594 B2 * | 7/2011 | Yoon .................. G03F 7/091 430/271.1 |
| 8,420,289 B2 * | 4/2013 | Kim .................... G03F 7/091 430/270.1 |
| 2006/0019195 A1 | 1/2006 | Hatakeyama et al. |
| 2006/0269867 A1 | 11/2006 | Uh et al. |
| 2007/0003863 A1 | 1/2007 | Uh et al. |

FOREIGN PATENT DOCUMENTS

| | | |
|---|---|---|
| CN | 101185030 | 5/2008 |
| JP | 2010524224 | 7/2010 |
| KR | 10-2000-0068366 A | 11/2000 |
| KR | 10-2005-0033443 A | 4/2005 |
| KR | 10-2006-0122449 A | 11/2006 |
| KR | 10-2006-0132069 A | 12/2006 |
| KR | 10-0874655 B1 | 12/2008 |
| WO | 2013-036027 | 3/2013 |

OTHER PUBLICATIONS

International Search Report for corresponding International PCT Application No. PCT/KR2014/007815.

* cited by examiner

*Primary Examiner* — Vickey Nerangis
(74) *Attorney, Agent, or Firm* — Hauptman Ham, LLP (57) ABSTRACT

The present invention relates to a novel multipurpose polymer and a composition containing the same. The polymer and the composition of the present invention are very useful for preparing a semiconductor device having very good mechanical and optical properties.

11 Claims, 3 Drawing Sheets

POLYMER AND COMPOSITION CONTAINING SAME

CROSS-REFERENCE TO RELATED APPLICATIONS

This application claims priority under 35 U.S.C. § 119 to Korean Patent Application No. 10-2013-0100031, filed on Aug. 23, 2013 and Korean Patent Application No. 10-2014-0105840, filed on Aug. 14, 2014, in the Korean Intellectual Property Office, the disclosure of which is incorporated herein by reference in its entirety.

TECHNICAL FIELD

The following disclosure relates to a novel polymer and a composition containing the same, and more specifically, to a novel polymer usable for various processes and a composition containing the same.

BACKGROUND

Integrated circuits have been developed into complex devices capable of including millions of transistors, capacitors and resistors on one chip. In accordance with development of chip designs, faster electric network and higher circuit density have been continually required.

The requirement for faster circuits having higher circuit densities has been directly reflected in materials used to fabricate such integrated circuits.

As size of patterns become decreased in accordance with miniaturization and integration of semiconductor devices, thickness of a photoresist film and thickness of the patterns become thinner to prevent a collapse phenomenon of the photoresist patterns.

However, it is difficult to etch a layer to be etched by using thinner photoresist patterns.

That is, according to high integration of the semiconductor device, an aspect ratio of the photoresist patterns obtained by a lithography process is increased, such that capillary force between the photoresist patterns during a subsequent washing process is also increased, thereby causing a problem in that the photoresist patterns are collapsed.

When the thickness of the photoresist film is decreased to be 200 nm or less in order to solve the problem, an etch selectivity of the photoresist patterns to a lower layer to be etched during a subsequent etching process using the photoresist patterns as an etching mask may not be sufficiently secured, such that it is not possible to form uniform circuit patterns.

In addition, since a photoresist material appropriate for short wavelength light source includes an aliphatic compound rather than an aromatic compound such as benzene as a main component, it is significantly difficult to secure sufficient etching resistance. For example, at the time of etching the layer to be etched, etc., formed of an insulating layer such as silicon oxide ($SiO_2$), deformation of the layer to be etched occurs, such that it is almost impossible to manufacture a semiconductor device.

Accordingly, in order to improve the disadvantage of difficulty in etching the layer which is etched by using thinner photoresist patterns, an inorganic or organic film material having strong etching resistance is introduced between the layer to be etched and the photoresist of a semiconductor substrate, wherein the film material is referred to as a hard mask.

In addition, a hard mask process means a process of etching the hard mask using the photoresist patterns to perform patterning, and etching the layer to be etched using the patterns of the hard mask.

In general, since the hard mask is capable of obtaining a sufficient selection ratio with respect to the lower layer even if the photoresist film has a thin thickness, the hard mask does not have limitation on coating thickness of the photoresist film to be formed.

However, the hard mask process not only requires a photoresist coating process and other separate deposition apparatuses, but also performs complex processes, such that there are problems in that deposition efficiency is low, throughput is decreased, and production cost is increased, etc.

Therefore, in order to simplify existing hard mask processes and to reduce the production cost, it is demanded to develop a hard mask composition capable of being formed by the same solution process as the photoresist coating process, and having excellent properties such as an excellent etch selectivity, etc., to the photoresist.

SUMMARY

An embodiment of the present invention is directed to providing a novel polymer usable for various processes such as a gap-fill process, a double patterning process, etc., as well as a hard mask.

Further, another embodiment of the present invention is directed to providing a composition containing the novel polymer and usages thereof.

In one general aspect, there is provided a novel polymer capable of being prepared by simple processes since the novel polymer is possible to be applied to a solution process, particularly, spin-coating, and having an excellent etch selectivity, wherein the polymer of the present invention is represented by Chemical Formula 1 or 2 below:

[Chemical Formula 1]

[Chemical Formula 2]

[in Chemical Formulas 1 and 2 above,

A or B is each independently (C6-C20)arylene or (C3-C20)heteroarylene;

C is (C1-C20)alkylene or (C6-C20)arylene;

the arylene and the heteroarylene of A or B and the arylene and the alkylene of C may be further substituted with hydroxy, halogen, (C1-C20)alkyl, (C1-C20)alkoxy, (C3-C20)cycloalkyl, (C6-C20)aryl and (C3-C20)heteroaryl;

p, q and r are an integer from 0 to 5, but p and q are not simultaneously 0; and m and n are an integer from 1 to 1000].

The Chemical Formula 1 according to an exemplary embodiment of the present invention may be represented by Chemical Formulas 3 and 4 below:

[Chemical Formula 3]

[Chemical Formula 4]

[in Chemical Formulas 3 and 4 above,

A or B is each independently (C6-C20)arylene or (C3-C20)heteroarylene;

the arylene and the heteroarylene of A or B may be further substituted with hydroxy, halogen, (C1-C20)alkyl, (C1-C20)alkoxy, (C3-C20)cycloalkyl, (C6-C20)aryl and (C3-C20)heteroaryl;

p and q are an integer from 1 to 5; and n is an integer from 1 to 1000].

In Chemical Formulas 1 to 4 according to an exemplary embodiment of the present invention, A or B is not limited, but preferably, may be each independently selected from the following Structural Formulas:

[in Structural Formulas above, $R_1$ to $R_4$ are hydrogen, halogen, hydroxy, (C1-C20)alkyl or (C6-C20)aryl].

In Chemical Formulas 1 and 2 according to an exemplary embodiment of the present invention, C may be selected from the following Structural Formulas:

[in Structural Formulas above,

$R_{11}$ to $R_{13}$ are hydrogen, halogen, hydroxy or (C1-C20)alkyl].

In Chemical Formulas 1 and 2 according to an exemplary embodiment of the present invention, preferably, A may be

5

B may be and C may be

In another general aspect, there is provided a composition including the polymer represented by Chemical Formula 1 or 2 as described above.

The composition according to an exemplary embodiment of the present invention may further include: a crosslinking agent and an acid catalyst. Specifically, the composition may include 1 to 40 wt % of the polymer, 0.1 to 40 wt % of the crosslinking agent, 0.001 to 10 wt % of the acid catalyst, and residual amount of a solvent.

In the composition according to an exemplary embodiment of the present invention, the crosslinking agent may be at least one selected from the group consisting of a melamine resin, an amino resin, a glycoluril compound and a bisepoxy compound, and the acid catalyst may be at least one selected from the group consisting of p-toluenesulfonic acid mono hydrate, pyridine p-toluenesulfonic acid, p-toluenesulfonic acid amine salts including p-toluenesulfonic acid triethylamine salt, 2,4,4,6-tetrabromocyclohexadienone, benzoin tosylate, and 2-nitrobenzyl tosylate.

The composition of the present invention is not limited in view of the usages, but preferably, the composition may be used for a gap-fill process, a double patterning process, or a hard mask.

DETAILED DESCRIPTION OF EMBODIMENTS

The present invention provides a novel polymer having excellent properties such as heat stability, an etch selectivity, etc., and represented by Chemical Formula 1 or 2 below:

[Chemical Formula 1]

[Chemical Formula 2]

[in Chemical Formulas 1 and 2 above, A or B is each independently (C6-C20)arylene or (C3-C20)heteroarylene;

C is (C1-C20)alkylene or (C6-C20)arylene;

the arylene and the heteroarylene of A or B and the arylene and the alkylene of C may be further substituted with hydroxy, halogen, (C1-C20)alkyl, (C1-C20)alkoxy, (C3-C20)cycloalkyl, (C6-C20)aryl and (C3-C20)heteroaryl;

p, q and r are an integer from 0 to 5, but p and q are not simultaneously 0; and m and n are an integer from 1 to 1000].

The polymer of the present invention includes at least two aromatic rings of aryl or heteroaryl, to have excellent optical properties and mechanical properties.

Specifically, the polymer of the present invention includes at least two aromatic rings of aryl or heteroaryl, wherein one of the aromatic rings necessarily includes methylene substituted with phenylene, such that the polymer has an excellent etch selectivity, mechanical properties, optical properties, and high solubility, thereby being applied even to a solution process.

Terms: "alkyl", "alkoxy", and other substituents including "alkyl" part described in the present invention include all linear or branched forms. In addition, "aryl" described in the present invention, which is an organic radical derived from aromatic hydrocarbon by removing one hydrogen, includes single or fused ring system including 4 to 7 ring atoms, preferably 5 or 6 ring atoms in each ring, and even includes a plurality of aryls linked by a single bond. Specific examples of aryl may include phenyl, naphthyl, biphenyl, anthryl, indenyl, fluorenyl, 9,9-diphenyl-9H-fluorene, etc., but the present invention is not limited thereto. That is, a compound induced by removing two hydrogens from 9,9-diphenyl-9H-fluorene described in the present invention also corresponds to arylene. Term "heteroaryl" described in the present invention, which means an aryl group containing 1 to 4 heteroatoms selected from B, N, O, S, P(=O), Si and P as an aromatic ring backbone atom and carbon as remaining aromatic ring backbone atom, may include 5- to 6-membered monocyclic heteroaryl and polycyclic heteroaryl condensed with at least one benzene ring, and may be partially saturated.

Preferably, Chemical Formula 1 according to an exemplary embodiment of the present invention may be represented by Chemical Formulas 3 and 4 below:

[Chemical Formula 3]

[Chemical Formula 4]

[in Chemical Formulas 3 and 4 above,

A or B is each independently (C6-C20)arylene or (C3-C20)heteroarylene;

the arylene and the heteroarylene of A or B may be further substituted with hydroxy, halogen, (C1-C20)alkyl, (C1-C20)alkoxy, (C3-C20)cycloalkyl, (C6-C20)aryl and (C3-C20)heteroaryl;

p and q are an integer from 1 to 5; and n is an integer from 1 to 1000].

In Chemical Formulas 1 to 4 according to an exemplary embodiment of the present invention, Chemical Formula 2 is more preferred in view of excellent effect.

In Chemical Formulas 1 to 4 according to an exemplary embodiment of the present invention, A or B may be each independently selected from the following Structural Formulas, but the present invention is not limited thereto:

[in Structural Formulas above,

$R_1$ to $R_4$ are hydrogen, halogen, hydroxy, (C1-C20)alkyl or (C6-C20)aryl].

In Chemical Formulas 1 to 4 above, A or B may be preferably each independently selected from the following Structural Formulas:

[in Structural Formulas above, $R_1$ to $R_4$ are hydrogen, halogen, hydroxy, (C1-C20)alkyl or (C6-C20)aryl].

In Chemical Formulas 1 and 2 above according to an exemplary embodiment of the present invention, C may be selected from the following Structural Formulas:

[in Structural Formulas above,

[R$_{11}$ to R$_{13}$ are hydrogen, halogen, hydroxy or (C1-C20) alkyl].

Preferably, in Chemical Formulas 1 and 2 above according to an exemplary embodiment of the present invention, C may be selected from the following Structural Formulas:

[in Structural Formulas above,

R$_{11}$ to R$_{12}$ are hydrogen, halogen, hydroxy or (C1-C20) alkyl].

In Chemical Formulas 1 and 2 according to an exemplary embodiment of the present invention, A and B may be each independently selected from the following Structural Formulas, in view of excellent etch selectivity:

[in Structural Formulas above,

R$_1$ to R$_4$ are hydrogen, halogen, hydroxy, (C1-C20)alkyl or (C6-C20)aryl].

In Chemical Formulas 1 and 2 above, cases in which C is selected from the following structures are preferred:

[in Structural Formulas above,

R$_{11}$ to R$_{12}$ are hydrogen, halogen, hydroxy or (C1-C20) alkyl].

More preferably, in Chemical Formulas 1 and 2 according to an exemplary embodiment of the present invention, A may be B may be and C may be In addition, the present invention provides a composition including the polymer represented by Chemical Formula 1 or 2 as described above.

The composition of the present invention includes the polymer represented by Chemical Formula 1 or 2 above of the present invention to have excellent mechanical and optical properties and high solubility, thereby being applied even to a solution process, such that the composition of the present invention may be mass-produced at low cost.

Further, the composition of the present invention is usable for a gap-fill process or a double patterning process, as well as for a hard mask, thereby being applicable for various usages. Further, at the time of manufacturing films such as the hard mask, etc., at a high temperature, it is possible to be cross-linked without using a separate crosslinking agent, such that the film having high purity may be obtained at low cost.

The composition according to an exemplary embodiment of the present invention may further include a crosslinking agent and an acid catalyst, and may not include the crosslinking agent and the acid catalyst depending on temperature.

Specifically, at the time of manufacturing the film at a high temperature (300 to 500° C.), the composition may not include the crosslinking agent and the acid catalyst, such that the film having high purity may be manufactured at low cost, and at the time of manufacturing the film at a low temperature (200 to 300° C.), the film may be manufactured by including the crosslinking agent and the acid catalyst.

The composition according to an exemplary embodiment of the present invention may include 1 to 40 wt % of the polymer, 0.1 to 40 wt % of the crosslinking agent, 0.001 to 10 wt % of the acid catalyst, and residual amount of a solvent, and preferably, may include 1 to 20 wt % of the polymer, 0.1 to 20 wt % of the crosslinking agent, 0.001 to 5 wt % of the acid catalyst, and residual amount of a solvent.

The solvent according to an exemplary embodiment of the present invention is not limited, but for example, may be at least one selected from the group consisting of tetrahydronaphthalene, propylene glycol monomethyl ether (PGME), propylene glycol monomethyl ether acetate (PGMEA), cyclohexanone, ethyl lactate, propylene glycol n-propyl ether, dimethylformamide (DMF), gamma-butyrolactone, ethoxy ethanol, methoxy ethanol, methyl 3-methoxypropionate (MMP), and ethyl 3-ethoxypropionate (EEP).

In the composition according to an exemplary embodiment of the present invention, the crosslinking agent may be at least one selected from the group consisting of a melamine resin, an amino resin, a glycoluril compound, and a bisepoxy compound. Specific examples of the crosslinking agent may include an N-methoxymethyl-melamine resin, an N-butoxymethyl-melamine resin, tetramethoxymethylglycoluril, and tetrabutoxymethylglycoluril.

The acid catalyst according to an exemplary embodiment of the present invention may be at least one selected from the group consisting of p-toluenesulfonic acid mono hydrate, pyridinium p-toluenesulfonate, 2,4,4,6-tetrabromocyclohexadienone, benzoin tosylate, and 2-nitrobenzyl tosylate.

The composition of the present invention is not limited in view of the usages, but preferably, the composition may be used for a gap-fill process, a double patterning process, or a hard mask.

The hard mask film manufactured by using the composition of the present invention may be formed through general methods by a person skilled in the art. Preferably, the hard mask film may be formed by spin-coating. Preferably, the hard mask film formed by general methods may be crosslinked by a baking method, wherein conditions such as temperature, etc., in the baking method are not limited as long as it is included in the general methods.

Hereinafter, specific exemplary embodiments of the present invention have been described for illustrative purposes, but it is not intended to limit the protective scope defined by the attached claims of the present invention.

EXAMPLE 1

Synthesis of Compound 1

A distillation apparatus was installed in a flask, 9,9-bis (4-hydroxyphenyl)fluorene (150 g), benzaldehyde (45 g), and toluenesulfonic acid monohydrate (6.3 g) as an acid catalyst were added to the flask, and tetrahydronaphthalene (300 mL) and toluene (30 mL) were added thereto, followed by stirring so as to dissolve the added materials. The obtained reaction mixture was heated at 140° C. and reacted for 9 hours. Then, for precipitation, ethyl acetate (300 mL) was added to dilute the reaction mixed solution, and the reaction mixed solution was allowed to be precipitated in hexane/isopropylalcohol mixed solution (7 L/3 L). The precipitated compound was filtered, washed with hexane, and vacuum-dried. It was confirmed by GPC that the dried compound had a weight average molecular weight of 5,000.

EXAMPLE 2

Synthesis of Compound 2

A distillation apparatus was installed in a flask, 4-phenylphenol (150 g), benzaldehyde (94 g), toluenesulfonic acid monohydrate (6.3 g) as an acid catalyst were added to the flask, and tetrahydronaphthalene (300 mL) and toluene (30 mL) were added thereto, followed by stirring so as to dissolve the added materials. The obtained reaction mixture was heated at 140° C. and reacted for 9 hours. Then, for precipitation, ethyl acetate (300 mL) was added to dilute the reaction mixed solution, and the reaction mixed solution was allowed to be precipitated in hexane/isopropylalcohol mixed solution (7 L/3 L). The precipitated compound was filtered, washed with hexane, and vacuum-dried. It was confirmed by GPC that the dried compound had a weight average molecular weight of 3,000.

EXAMPLE 3

Synthesis of Compound 3

A distillation apparatus was installed in a flask, 9,9-bis (4-hydroxyphenyl)fluorene (100 g), 4-phenylphenol (50 g), benzaldehyde (64 g), and toluenesulfonic acid monohydrate (6.3 g) as an acid catalyst were added to the flask, and tetrahydronaphthalene (300 mL) and toluene(30 mL) were added thereto, followed by stirring so as to dissolve the added materials. The obtained reaction mixture was heated at 140° C. and reacted for 9 hours. Then, for precipitation, ethyl acetate (300 mL) was added to dilute the reaction mixed solution, and the reaction mixed solution was allowed to be precipitated in hexane/isopropylalcohol mixed solution (7 L/3 L). The precipitated compound was filtered, washed with hexane, and vacuum-dried. It was confirmed by GPC that the dried compound had a weight average molecular weight of 4,500.

EXAMPLE 4

Preparation of Composition for Spin-coating

The compound 1 (6 g) synthesized by Example 1 was dissolved in propyleneglycol monomethyletheracetate (100 g), and filtered through a membrane filter (0.2 μm) to prepare a composition for spin-coating.

EXAMPLE 5

Preparation of Composition for Spin-coating

The compound 3 (6 g) synthesized by Example 3 was dissolved in propyleneglycol monomethyletheracetate (100 g), and filtered through a membrane filter (0.2 μm) to prepare a composition for spin-coating.

EXAMPLE 6

Preparation of Composition for Spin-coating

The compound 1 (11 g) synthesized by Example 1, tetramethoxymethylglycoluril (1.1 g) as a crosslinking agent, and pyridinium p-toluenesulfonate (0.2 g) as an acid catalyst were dissolved in propyleneglycol monomethyl ether acetate (100 g), and filtered through a membrane filter (0.2 μm) to prepare a composition for spin-coating.

EXAMPLE 7

Preparation of Composition for Spin-coating

The compound 3 (11 g) synthesized by Example 3, tetramethoxymethylglycoluril (1.1 g) as a crosslinking agent, and pyridinium p-toluenesulfonate (0.2 g) as an acid catalyst were dissolved in propyleneglycol monomethyl ether acetate (100 g), and filtered through a membrane filter (0.2 μm) to prepare a composition for spin-coating.

EXPERIMENTAL EXAMPLE 1

Stripping Test

The compositions prepared by Examples 4 and 5 were spin-coated on silicon wafers, respectively, followed by a baking process in a hot plate at 200° C. for 60 seconds and in a hot plate at 340° C. for 60 seconds so as to be crosslinked, thereby forming each carbon film. After a thickness of each coated film was measured, the coated wafer was soaked in propylene glycol monomethyl ether acetate for 1 minute. After 1 minute, propylene glycol monomethyl ether acetate was completely removed, the thickness of each film was measured. As a result, change in thickness could not be observed in both of the compositions of Examples 4 and 5. Based on the results, it could be confirmed that the prepared compositions were completely cured during the baking process after being applied, and mutual intermixing with other film materials did not occur during the process of applying the materials.

EXPERIMENTAL EXAMPLE 2

Measurement of Heat Resistance (TG)

Figure 1:
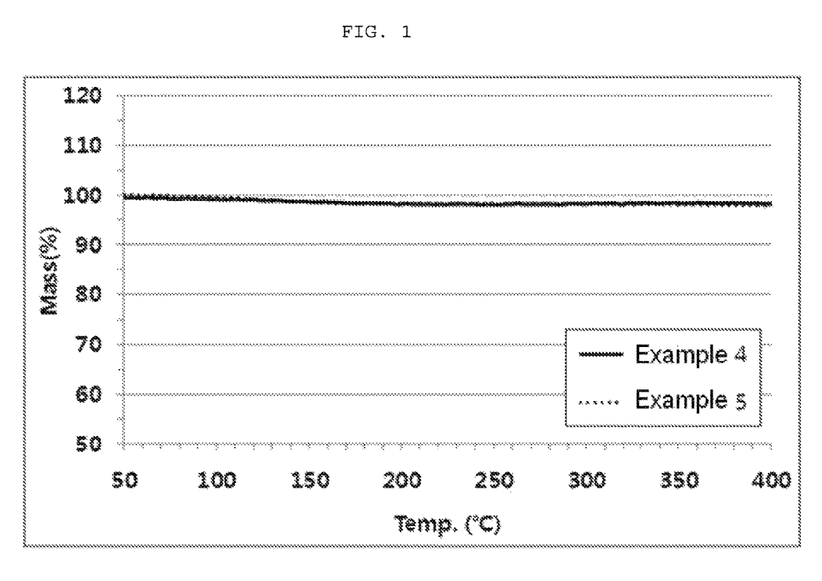
FIG. 1 shows heat resistance (TG/DTA) results of carbon thin films formed from compositions of Examples 4 and 5.

In order to confirm heat resistance, the compositions prepared by Examples 4 and 5 were spin-coated on silicon wafers, respectively, followed by a baking process in a hot plate at 200° C. for 60 seconds and in a hot plate at 400° C. for 60 seconds so as to be crosslinked, and applied. Then, TG analysis up to 400° C. was performed on the obtained compositions. Results thereof were shown in FIG. 1, and it was confirmed that both of the compositions of Examples 4 and 5 had 1% or less loss in mass up to 400° C., and had high heat resistance to provide high heat stability.

EXPERIMENTAL EXAMPLE 3

Stripping Test

The compositions prepared by Examples 6 and 7 were spin-coated on silicon wafers, respectively, followed by a baking process in a hot plate at 24020 C. for 60 seconds so as to be crosslinked, thereby forming each carbon film. After a thickness of each coated film was measured, the coated wafer was soaked in propylene glycol monomethyl ether acetate for 1 minute. After 1 minute, propylene glycol monomethyl ether acetate was completely removed, the thickness of each film was measured. As a result, change in thickness could not be observed in both of the compositions of Examples 6 and 7. Based on the results, it could be confirmed that the prepared compositions were completely cured during the baking process after being applied, and mutual intermixing with other film materials did not occur during the process of applying the materials.

EXPERIMENTAL EXAMPLE 4

Shrinkage Rate Test

The compositions prepared by Examples 4 and 5 were spin-coated on silicon wafers, respectively, followed by a baking process in a hot plate at 200° C. for 60 seconds, and a thickness of each manufactured film was measured. Next, the film was subjected to a baking process in a hot plate at 340° C. for 60 seconds so as to be crosslinked, thereby forming each carbon film. Then, the thickness of each film was measured (KLA_Tencor Corp., SPECTRA FX100) to confirm shrinkage rate of the coated thin films. Results thereof were shown in Table 1 below.

TABLE 1

|  | No. | Thickness of initial thin film (Å) | Thickness of thin film after baking at 340° C. (Å) | Shrinkage rate (%) | |
|---|---|---|---|---|---|
| Example 4 | 1 | 1,383 | 1,333 | −3.6 | −3.5 |
|  | 2 | 1,380 | 1,332 | −3.5 | |
|  | 3 | 1,379 | 1,332 | −3.4 | |

TABLE 1-continued

|  | No. | Thickness of initial thin film (Å) | Thickness of thin film after baking at 340° C. (Å) | Shrinkage rate (%) | |
|---|---|---|---|---|---|
| Example 5 | 1 | 1,383 | 1,348 | −2.5 | −2.6 |
|  | 2 | 1,385 | 1,347 | −2.7 | |
|  | 3 | 1,382 | 1,345 | −2.7 | |

Referring to Table 1, it could be appreciated that the carbon thin film formed of the composition of Example 5 had a lower shrinkage rate than that of the carbon thin film formed of the composition of Example 4.

EXPERIMENTAL EXAMPLE 5

Etching Resistance Test

The compositions prepared by Examples 4 and 5 were spin-coated on silicon wafers, respectively, followed by a baking process in a hot plate at 200° C. for 60 seconds and in a hot plate at 340° C. for 60 seconds so as to be crosslinked, thereby forming each carbon thin film.

Next, each thin film was dry-etched for 15 seconds using $Ar/N_2/O_2$ mixed gas, and a thickness of each thin film was measured. In addition, each thin film was dry-etched for 15 seconds using $CF_4/Ar/O_2$ mixed gas, and a thickness of each thin film was measured. Results thereof were shown in Table 2 below.

TABLE 2

|  |  | $Ar/N_2/O_2$ | | | | $CF_4/Ar/O_2$ | | | |
|---|---|---|---|---|---|---|---|---|---|
|  | No. | Thickness of initial thin film (Å) | Thickness of thin film after etching (Å) | Etching ratio (Å/s) | | Thickness of initial thin film (Å) | Thickness of thin film after etching (Å) | Etching ratio (Å/s) | |
| Example 4 | 1 | 1,346 | 670 | 45.1 | 45.0 | 1,345 | 825 | 34.7 | 34.9 |
|  | 2 | 1,335 | 662 | 44.9 | | 1,335 | 810 | 35.0 | |
|  | 3 | 1,341 | 664 | 45.1 | | 1,340 | 814 | 35.1 | |
| Example 5 | 1 | 1,342 | 745 | 39.8 | 40.1 | 1,338 | 875 | 30.9 | 30.8 |
|  | 2 | 1,335 | 730 | 40.3 | | 1,336 | 872 | 30.9 | |
|  | 3 | 1,337 | 736 | 40.1 | | 1,336 | 878 | 30.5 | |

* Etching ratio: (Thickness of initial thin film − Thickness of thin film after etching)/Etching time (sec)

Referring to Table 2, it could be appreciated that the carbon thin film formed of the composition of Example 5 had higher etching resistance than that of the carbon thin film formed of the composition of Example 4.

EXPERIMENTAL EXAMPLE 6

Etching Resistance Test

The compositions prepared by Examples 6 and 7 were spin-coated on silicon wafers, respectively, followed by a baking process in a hot plate at 240° C. for 60 seconds so as to be crosslinked, thereby forming each carbon film. Next, each thin film was dry-etched for 30 seconds using $Ar/N_2/O_2$ mixed gas, and a thickness of each thin film was measured. In addition, each thin film was dry-etched for 30 seconds using $CF_4/Ar/O_2$ mixed gas, and a thickness of each thin film was measured. Results thereof were shown in Table 3 below.

TABLE 3

| | No. | Ar/N$_2$/O$_2$ | | | CF$_4$/Ar/O$_2$ | | |
| | | Thickness of initial thin film (Å) | Thickness of thin film after etching (Å) | Etching ratio (Å/s) | Thickness of initial thin film (Å) | Thickness of thin film after etching (Å) | Etching ratio (Å/s) |
|---|---|---|---|---|---|---|---|
| Example 6 | 1 | 3,310 | 1,720 | 53.0  52.8 | 3,305 | 2,012 | 43.1  43.2 |
| | 2 | 3,281 | 1,702 | 52.6 | 3,298 | 2,001 | 43.2 |
| | 3 | 3,299 | 1,718 | 52.7 | 3,310 | 2,010 | 43.3 |
| Example 7 | 1 | 3,312 | 1,855 | 48.6  48.8 | 3,310 | 2,150 | 38.7  38.6 |
| | 2 | 3,308 | 1,845 | 48.8 | 3,312 | 2,155 | 38.6 |
| | 3 | 3,316 | 1,848 | 48.9 | 3,306 | 2,150 | 38.5 |

* Etching ratio: (Thickness of initial thin film − Thickness of thin film after etching)/Etching time (sec)

Referring to Table 3, it could be appreciated that both of the carbon thin film formed of the composition of Example 6 and the carbon thin film formed of the composition of Example 7 had high etching resistance.

EXPERIMENTAL EXAMPLE 7

Confirmation of Carbon Content

Figure 2:
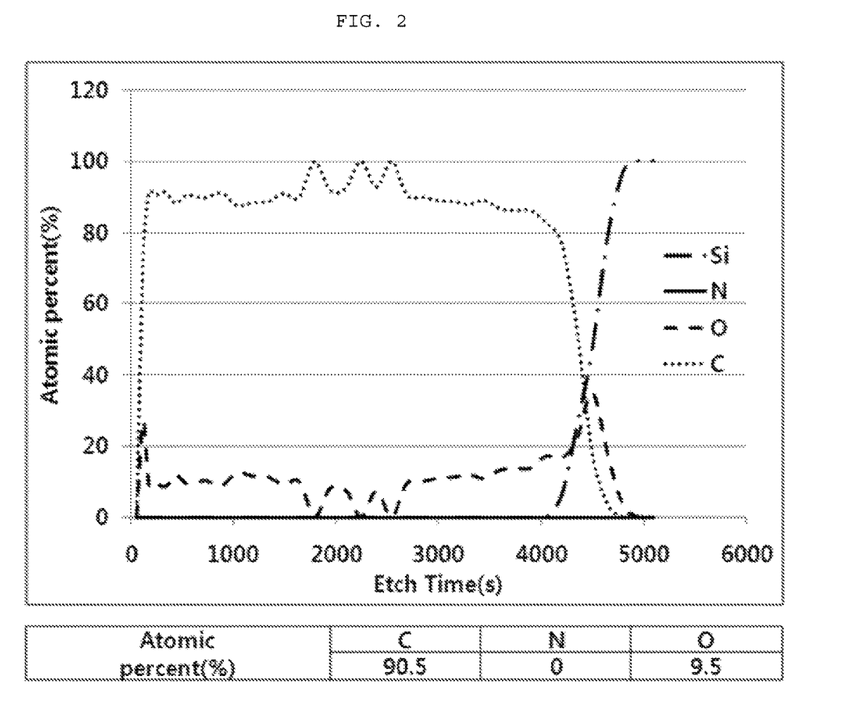
FIG. 2 shows elemental analysis (AES depth) results of the carbon thin film formed from the polymer prepared in Example 4.

The composition prepared by Example 4 was spin-coated on silicon wafer, followed by a baking process in a hot plate at 200° C. for 60 seconds and in a hot plate at 340° C. for 60 seconds so as to be crosslinked, thereby forming a thin film. Next, contents of C, N and O elements were measured by AES Depth equipment (Thermo Electron Corporation, MICROLAB 350). Results thereof were shown in FIG. 2, and it could be confirmed that C content was 90.5% and O content was 9.5%, and accordingly, a film material having significantly high carbon content was formed.

EXPERIMENTAL EXAMPLE 8

Measurement of Contact Angle

The compositions prepared by Examples 4 and 5 were spin-coated on silicon wafer, respectively, followed by a baking process in a hot plate at 200° C. for 60 seconds and in a hot plate at 340° C. for 60 seconds so as to be crosslinked, thereby forming each thin film. Contact angle of each thin film was measured by a contact angle meter (KRUSS Company, FM40 Easy drop). Results thereof were shown in Table 4 below.

TABLE 4

| | No. | Contact angle after baking at 200° C. (Deg.) | Contact angle after baking at 340° C. (Deg.) | Deviation (Deg.) |
|---|---|---|---|---|
| Example 4 | 1 | 76.8 | 76.5 | −0.3 |
| | 2 | 76.6 | 76.4 | −0.2 |
| | 3 | 76.8 | 76.7 | −0.1 |
| Example 5 | 1 | 76.9 | 76.5 | −0.4 |
| | 2 | 76.6 | 76.5 | −0.1 |
| | 3 | 76.7 | 76.5 | −0.2 |

As shown in Table 4, it could be appreciated that the contact angle of the carbon thin film formed of the composition of Example 4 was similar to that of the carbon thin film formed of the composition of Example 5.

EXPERIMENTAL EXAMPLE 9

Measurement of OutGas Amount

Figure 3:
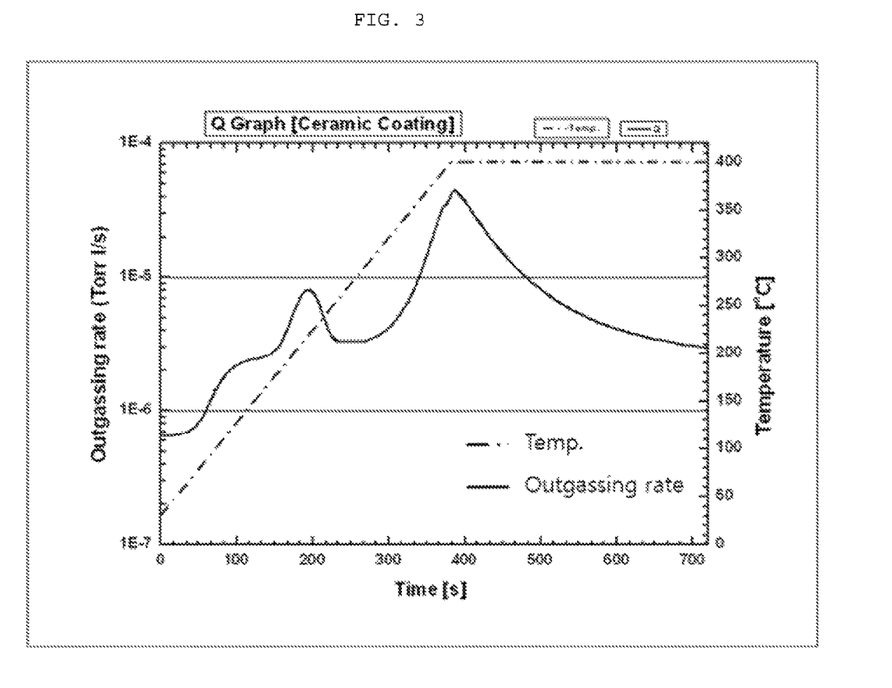
FIG. 3 shows outgas mass spectrometry (QMS) results of the carbon thin film formed from the polymer prepared in Example 4.

The composition prepared by Example 4 was spin-coated on silicon wafer, followed by a baking process in a hot plate at 200° C. for 60 seconds and in a hot plate at 340° C. for 60 seconds so as to be crosslinked, thereby forming a thin film. The wafer coated with the thin film was cut into a sample in a size of 1 cm×1 cm, and outgas amount was measured by using mass spectrometry equipment (Pfeiffer Vacuum Company, QMA-200). Results thereof were shown in FIG. 3.

The polymer and the composition according to the present invention may be prepared by simple processes, and may be used for various usages such as a gap-fill process, a double patterning process, etc., as well as a hard mask.

In addition, the polymer and the composition according to the present invention are possible to produce an excellent semiconductor device due to an excellent etch selectivity.

Further, the polymer and the composition according to the present invention may be prepared by simple processes since the polymer and the composition may be applied to a solution process, thereby reducing production cost, and may also be mass-produced.

What is claimed is:

1. A polymer represented by Chemical Formula 1 or 2 below:

[Chemical Formula 1]

[Chemical Formula 2]

wherein

A and B are each independently selected from (C6-C20) arylene and (C3-C20)heteroarylene;

C is

Structural Formula 3 wherein $R_{11}$, $R_{12}$, and $R_{13}$ are independently selected from hydrogen, halogen, hydroxy and (C1-C20)alkyl;

A and B may be further be independently substituted with hydroxy, halogen, (C1-C20)alkyl, (C1-C20)alkoxy, (C3-C20)cycloalkyl, (C6-C20)aryl and (C3-C20)heteroaryl;

p and q are independently selected integers from 0 to 5, wherein p+q>0;

r is an integer from 1 to 5; and m and n are each an independent integer from 1 to 1000.

2. The polymer of claim 1, wherein the Chemical Formula 1 is represented by Chemical Formulas 3 or 4 below:

Chemical Formula 3

Chemical Formula 4

3. The polymer of claim 2, wherein A and B are each independently selected from the following Structural Formulas 6-16:

Structural Formula 6

Structural Formula 7

Structural Formula 8

Structural Formula 9

Structural Formula 10

Structural Formula 11

Structural Formula 12

Structural Formula 13

Structural Formula 14

Structural Formula 15

Structural Formula 16 wherein, $R_1$ to $R_4$ are independently selected from hydrogen, halogen, hydroxy, (C1-C20)alkyl and (C6-C20) aryl.

4. The polymer of claim 1, wherein A and B are each independently selected from the following Structural Formulas 6-16:

Structural Formula 6

Structural Formula 7

Structural Formula 8

Structural Formula 9

Structural Formula 10

Structural Formula 11

Structural Formula 12

Structural Formula 13

Structural Formula 14

Structural Formula 15

-continued

Structural Formula 16 wherein,

R₁ to R₄ are independently selected from hydrogen, halogen, hydroxy, (C1-C20)alkyl and (C6-C20)aryl.

5. The polymer of claim 1, wherein
A is

,and

B is

6. A composition comprising a polymer represented by Chemical Formula 1 or 2 below:

Chemical Formula 1

Chemical Formula 2 wherein
A and B are each independently selected from (C6-C20)arylene and (C3-C20)heteroarylene;
C is Structural Formula 3 wherein $R_{11}$, $R_{12}$, and $R_{13}$ are independently selected from hydrogen, halogen, hydroxy and (C1-C20)alkyl;
A and B may be further be independently substituted with hydroxy, halogen, (C1-C20)alkyl, (C1-C20)alkoxy, (C3-C20)cycloalkyl, (C6-C20)aryl and (C3-C20)heteroaryl;
p and q are independently selected integers from 0 to 5, wherein p+q>0;
r is an integer from 1 to 5; and
m and n are each an independent integer from 1 to 1000.

7. The composition of claim 6, further comprising: a crosslinking agent and an acid catalyst.

8. The composition of claim 7, wherein the composition includes 1 to 40 wt % of the polymer, 0.1 to 40 wt % of the crosslinking agent, 0.001 to 10 wt % of the acid catalyst, and residual amount of a solvent.

9. The composition of claim 7, wherein the crosslinking agent is at least one selected from the group consisting of a melamine resin, an amino resin, a glycoluril compound and a bisepoxy compound.

10. The composition of claim 7, wherein the acid catalyst is at least one selected from the group consisting of p-toluenesulfonic acid mono hydrate, pyridinium p-toluenesulfonic acid, p-toluenesulfonic acid amine salts including p-toluenesulfonic acid triethylamine salt, 2,4,4,6-tetrabromocyclohexadienone, benzoin tosylate, and 2-nitrobenzyl tosylate.

11. The composition of claim 6, wherein the composition is used for a gap-fill process, a double patterning process, or a hard mask.

* * * * *